United States Patent
Birk et al.

(10) Patent No.: US 6,768,358 B2
(45) Date of Patent: Jul. 27, 2004

(54) PHASE LOCKED LOOP FAST POWER UP METHODS AND APPARATUS

(75) Inventors: Palle Birk, Gistrup (DK); Joern Soerensen, Aars (DK)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/230,868

(22) Filed: Aug. 29, 2002

(65) Prior Publication Data

US 2003/0058052 A1 Mar. 27, 2003

Related U.S. Application Data

(60) Provisional application No. 60/315,655, filed on Aug. 29, 2001.

(51) Int. Cl.[7] .................................................. H03L 7/06
(52) U.S. Cl. ......................... 327/156; 327/147; 375/376; 331/DIG. 2
(58) Field of Search .......................... 327/156, 147, 327/142, 114, 116, 119–122; 377/47, 48; 331/DIG. 2, 1 A, 17

(56) References Cited

U.S. PATENT DOCUMENTS

| | | | |
|---|---|---|---|
| 5,606,293 A | 2/1997 | Matsui et al. ................... 331/74 |
| 5,623,234 A | 4/1997 | Shaik et al. ..................... 331/49 |
| 5,774,701 A | 6/1998 | Matsui et al. .................. 713/501 |
| 5,963,068 A | * 10/1999 | Hardesty et al. ............... 327/156 |
| 6,005,904 A | 12/1999 | Knapp et al. ................... 375/376 |
| 6,031,429 A | * 2/2000 | Shen .............................. 331/17 |
| 6,118,306 A | 9/2000 | Orton et al. ..................... 327/44 |
| 6,255,882 B1 | * 7/2001 | Hirai ............................. 327/291 |
| 6,356,128 B2 | * 3/2002 | Suga et al. ..................... 327/160 |

FOREIGN PATENT DOCUMENTS

| | | |
|---|---|---|
| EP | 0632360 A1 | 1/1995 |
| EP | 0 895 358 A2 | 2/1999 |
| EP | 0978781 A2 | 2/2000 |

* cited by examiner

Primary Examiner—Minh Nguyen
(74) Attorney, Agent, or Firm—Wolf, Greenfield & Sacks, P.C.

(57) ABSTRACT

A PLL frequency multiplier is provided having a latency substantially equal to the wake-up time of the PLL. An operative clock signal is provided to a processor while the PLL is acquiring phase lock by ensuring that the clock signal does not contain frequencies above a target frequency of a PLL and below a predetermined threshold frequency. In particular, a frequency divider and a frequency detector are provided to prevent the frequency of the clock signal from operating outside the range defined by the threshold and target frequencies.

33 Claims, 6 Drawing Sheets

PHASE LOCKED LOOP FAST POWER UP METHODS AND APPARATUS

RELATED APPLICATIONS

This application claims the benefit of U.S. Provisional Application No. 60/315,655 under 35 U.S.C. §119(e) filed Aug. 29, 2001, entitled "DIGITAL BASEBAND PROCESSOR," by Allen, et al. The entirety of the above provisional application is hereby incorporated by reference.

FIELD OF THE INVENTION

This invention relates to the field of phase locked loop (PLL) frequency multipliers and, more particularly, to methods and apparatus for reducing the overhead associated with activating a PLL by providing an operative clock signal during the lock-time interval of the PLL.

BACKGROUND OF THE INVENTION

In many computing systems, digital devices, etc., the various clock signals required by a processor are often synchronized to a single reference clock signal and then distributed to the appropriate logic circuits, subsystems and components of the processor. The term processor refers, generally, to any apparatus that performs logic operations, computational tasks, and/or control functions. A processor may include one or more subsystems, components, and/or other processors. A processor will typically include various logic and/or digital components that operate using a clock signal to latch data, advance and/or sequence logic states, synchronize computations and logic operations, and/or provide other timing functions.

A cellular phone, for example, may include a processor having multiple subsystems or components such as a digital signal processor (DSP) operating at a high clock frequency in order to perform real-time, computationally intensive and often time-critical tasks, and a micro-controller (MCU) operating at a lower clock frequency to, for example, carry out various control functions, coordinate events, execute system software, etc. Moreover, the DSP and the MCU may each operate or have supporting components that operate at multiple clock frequencies. The clock frequency requirement at any given time may depend on the computational demands of the processor.

A frequency multiplier implemented by an analog or digital phase-locked loop (PLL) or delay-locked loop (DLL) is often employed to generate a high frequency clock signal and lock it in-phase with a reference clock. The high frequency clock signal may then be supplied to drive a logic circuit or component, provided to a clock distribution tree of a digital device, and/or otherwise distributed to a processor to meet the clocking requirements of the system. Thus, the clock frequency requirements of the various components of a processor may be supported from, and synchronized to, a single reference clock signal.

The term "provided" in the context of providing a clock signal describes a signal that is not disabled, bypassed, gated off, or otherwise prevented from being applied to, received by, and used for operation by the intended logic gates, digital components and/or circuitry, etc. In general, the term clocked component will be used herein to describe any of the above mentioned components. For instance, a clock signal may be provided to a bypass select, disable logic, clock distribution tree, etc., but is ultimately provided to a one or more low level components such as logic gates, flip-flops etc., requiring a clock as a logic level, a timing signal, a latch, etc. These low level components or collections of such low level components are referred to generally as clocked components.

FIG. 1 illustrates a block diagram of a conventional frequency multiplier 10 that generates an output clock signal from an input clock signal. Frequency multiplier 10 includes a PLL 12 that generates a high frequency output clock signal 32 and locks the signal in phase with input clock signal 30.

The term clock signal, or simply clock, refers generally to any analog or digital periodic signal and, more particularly, a periodic signal used for or used to generate at least one timing signal or logic level for a logic component, digital circuit, or otherwise (i.e., a clocked component). A clock signal may be any of various waveforms including, but not limited to, sinusoids, square waves, pulse trains, etc. For example, a clock signal may be a signal that is ultimately used to advance the state of a processor, latch data, perform logic operations, etc. Signals such as swing sinusoids and signals from, for example, crystal oscillators from which one or more clock signals are formed and/or derived are additionally to be considered clock signals.

PLL 12 includes a phase comparator 22, a loop filter 24, a voltage controlled oscillator 26 and a divider 28. Phase comparator 22 receives an input clock signal 30 and a feedback clock signal 34 and compares the phase of the two signals. Input clock signal 30 may be, for example, a system clock that provides a processor with a reference clock with which to synchronize the higher frequency clock signals distributed to the processor. Feedback signal 34 is related to the output clock signal 32, having substantially the same phase as the output clock signal 32 and substantially the same frequency as the input clock signal 30. Phase comparator 22 provides a phase error signal 40 proportional to the phase difference between the input clock signal 30 and the feedback clock signal 34.

Loop filter 24 provides noise removal and smoothing to the phase error signal 40. For example, loop filter 24 may include a low pass filter. In addition, loop filter 24 transforms the phase error signal 40 into a signal indicating a change in voltage required to reduce the magnitude of the phase error signal 40. Voltage correction signal 42, produced by the loop filter 24, is provided to the VCO to correct for the phase difference between input clock signal 30 and feedback signal 34.

A voltage controlled oscillator (VCO) typically provides a voltage to an oscillator which produces a signal having a frequency proportional to the provided voltage. As such, VCO 26 receives voltage correction signal 42 from loop filter 24 and adjusts a voltage supplied to the oscillator accordingly. The frequency of the output clock signal 32 is thereby adjusted to correct for the phase error detected by the phase comparator 22 (i.e., the output clock signal 32 is urged in-phase with the input clock signal 30).

The output clock signal 32 is fed back to the phase comparator through divider 28. Divider 28 may be, for example, a divide-by-n counter that divides the frequency of the output clock signal to provide feedback clock signal 34 for comparison with the input clock signal 30. As such, the divider ratio n is typically chosen to match the multiplier ratio achieved by the VCO, thus providing the feedback clock signal having substantially the same frequency as the input clock signal and having substantially the same phase as the output clock signal.

Typically, there are various delays associated generating an output clock signal that is phase-locked to an input clock signal. In particular, there is an interval of time required for the phase-locked loop to converge (i.e., to lock the output clock signal in-phase with the input clock signal). The delay incurred while acquiring phase lock is often referred to as lock time.

FIG. 2 depicts a timing diagram illustrating delays often associated with generating an output clock signal that is phase-locked to an input clock signal by means of a frequency multiplier such as that illustrated in FIG. 1. Plot 5 illustrates the frequency of an output clock signal (e.g., output clock signal 32) as a function of time. In FIG. 2, it will be assumed that the PLL is not active at time $t_0$. For example, no input clock signal is provided to the PLL, the VCO is not enabled, and no output clock signal is generated. In other words, time $t_0$ signifies the moment when it is first desired to supply an input clock to the frequency multiplier and power up the VCO, that is, when it is desired to activate the PLL.

A finite amount of time may be required before a stable input clock can be provided to the phase comparator of the PLL. This time is part of an interval, referred to as wake-up time, and indicated as interval 60. Different PLL or DLL implementations may have other delays associated with the wake-up time. For instance, in the PLL of FIG. 1, there may be a delay associated with enabling the VCO to begin providing a voltage to the oscillator. In general, wake-up time refers to the interval of time associated with enabling the various signals and/or components of the PLL. In particular, wake-up time refers to the interval of time between the moment it is desired to generate an output clock signal and the time the signal generator first outputs a signal.

In addition, there may be delays associated with the time required for the PLL to acquire phase lock between an input and an output clock signal. These delays are indicated as time intervals 64 and 66, referred to as PLL lock time and PLL lock timer, respectively. Time interval 64 indicates the actual time necessary to acquire a phase lock between the input clock signal and the output clock signal. However, it is often difficult to precisely detect when the PLL has been effectively locked. To complicate this matter, the actual lock time may vary as function of the desired frequency increase of the multiplier, the amount of noise in the input clock signal, etc. As such, there may be a degree of uncertainty in predicting the lock time of a PLL.

To combat the uncertainty involved in detecting and/or predicting the actual lock time, a lock timer may be employed to record an interval of time equal to or beyond the worst case lock time of the PLL. The lock timer begins to count down when the PLL is first activated. Typically, the PLL will not be considered locked and stable until the lock timer expires. Accordingly, the latency of a frequency multiplier is often constrained by the delay recorded in the lock timer (e.g., interval 66). The term latency refers, generally, to an interval of time that elapses before an operative clock signal is output from a frequency multiplier.

An operative clock signal refers to a clock signal that may be provided to a clocked component in order to perform its intended function. In general, an operative clock signal provides a useable timing reference and/or logic signal such that useful computation and/or processing may be performed without loss of data or other deleterious effects. For example, an operative clock signal may be a clock signal that is sufficient to advance a processor, latch data, synchronize logic events, and/or perform other logic operations requiring a clock signal without operating outside the tolerances of the clocked components and without causing the clocked components to operate erroneously.

Various methods have been proposed to decrease the latency of a frequency multiplier. However, these methods often focus on reducing the lock time of the phase locked loop, and as a result, reducing the delay required by the lock timer to accommodate the worst case lock time.

SUMMARY OF THE INVENTION

Applicants herein have observed that the latency obtained by methods of reducing the frequency multiplier lock-time may still suffer from significant loss of processing time and power consumption while the system waits for the frequency multiplier to acquire phase lock. In addition, some processing situations may require a frequency multiplier having a latency smaller than that obtained by methods of reducing the lock time.

Accordingly, one embodiment according to the present invention includes a method of reducing the overhead of activating a frequency multiplier providing a first output clock signal to be synchronized to an input clock signal. The method comprises acts of providing an input clock signal having a first frequency to the frequency multiplier with which to synchronize the first output clock signal, generating the first output clock signal having a second frequency that substantially converges to a target frequency, the target frequency greater than the first frequency, the generation of the first output clock signal determining the beginning of a lock time interval, generating a second output clock signal from the first output clock signal, the second output clock signal having a third frequency that is less than the second frequency and not exceeding the target frequency, determining when the first output clock signal is synchronized with the input clock signal, the determination of synchronization ending the lock time interval, and providing the second output clock signal to at least one clocked component during the lock time interval and providing the first output clock signal to the at least one clocked component after the lock time interval.

Another embodiment according to the present invention includes a method a method of providing an operative clock signal during a lock time interval of a frequency multiplier adapted to provide an output clock signal synchronized to an input clock signal. The method comprises acts of reducing a phase difference between the input clock signal and the output clock signal to essentially zero by coupling the input clock signal and the output clock signal in a feedback control loop. During the act of reducing the phase difference between the input clock signal and the output clock signal, the method further comprises acts of dividing a frequency of the output clock frequency by N to provide a reduced frequency clock signal, and providing the reduced frequency clock signal to at least one clocked component only after detecting that a frequency of the reduced frequency clock signal has exceeded a predetermined threshold frequency.

Another embodiment according to the present invention includes a comparator to receive an input clock signal having a first frequency and a feedback signal, the comparator adapted to provide an error signal indicative of a difference in a first property of the input clock signal and the feedback signal, a signal generator coupled to the comparator to provide an output clock signal having a second frequency, the generator adjusting a second property of the output clock signal based on the error signal to reduce the difference in the first property of the input clock signal and the feedback signal, a feedback loop providing the feedback signal from the output clock signal to the comparator, the feedback loop having associated with it a first interval of time required in order to reduce the difference in the first property between the input clock signal and the output clock signal to essentially zero, and means for providing an operative signal from the output clock signal during the first interval of time.

Another embodiment according to the present invention includes a frequency multiplier adapted to provide an operative clock signal before an output clock signal has been synchronized to an input clock signal. The frequency multiplier comprises a comparator to receive an input clock signal having a first frequency and a feedback signal, the comparator adapted to provide an error signal indicative of a difference in a first property between the input clock signal and the feedback signal, a signal generator coupled to the comparator to provide an output clock signal having a second frequency, the generator adjusting a second property of the output clock signal based on the error signal to reduce the difference in the first property between the input clock signal and the feedback signal, a first divider to reduce the second frequency to generate the feedback clock signal provided to the phase comparator, a second divider to divide the second frequency by N to provide a second output clock signal having a third frequency, and a detector adapted to monitor at least one of the first output clock signal and the second output clock signal, the detector configured to provide the second output clock signal to at least one clocked component only after the detector has determined that the third frequency has exceeded a predetermined threshold frequency, the predetermined threshold frequency greater than the first frequency.

DETAILED DESCRIPTION

In many devices, particularly battery powered devices such as cellular telephones, laptop computers, personal digital assistants (PDAs), and other hand held devices, power consumption may negatively effect the time with which these devices may be operated before requiring a recharge or an alternate power source.

Applicants have observed that power consumption of a device is related to the square of the voltage supplied to the device's processor and proportional to the frequency at which the processor operates. The power consumption of a device may be expressed as:

$$P_D = cV^2F \quad \text{(Equation 1)}$$

where,

V=the voltage supplied to the processor (i.e., the difference between Vdd and Gnd)
F=the frequency (e.g., the clock frequency of a processor)
c=a constant determined by the circuits operating at V and F.

In addition, Applicant has recognized that the voltage needed to operate the processor may be a function of the clock frequency provided to a processor. Accordingly, one way to reduce power consumption is to dynamically adjust the frequency provided to a processor to the minimum frequency required to meet the computational and/or processing demands of the processor.

Figure 3:
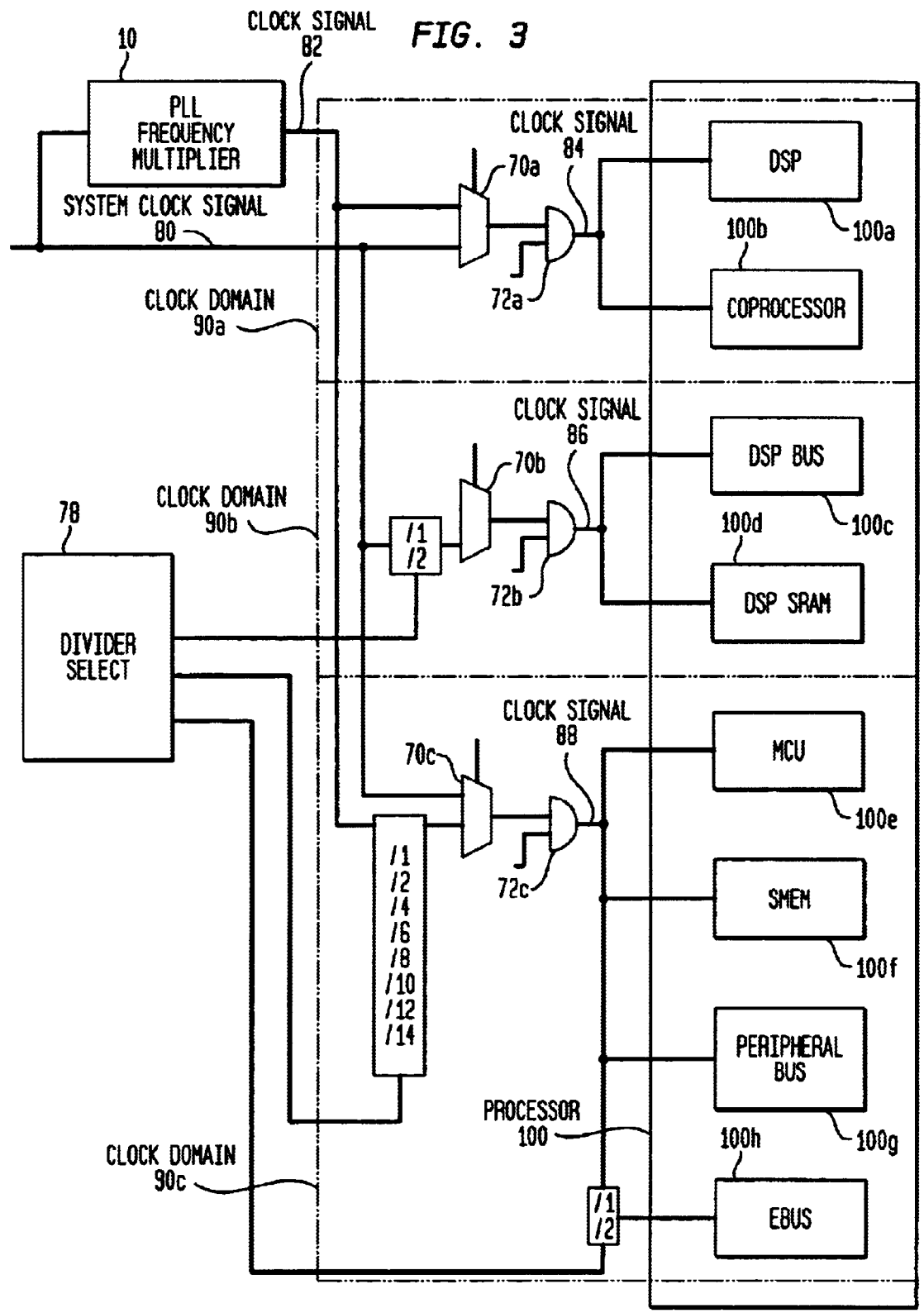
FIG. 3 illustrates a clocking scheme and control for a processor including a PLL frequency multiplier.

The system clocking scheme depicted in FIG. 3 will be used to illustrate various processing situations that may arise in an exemplary processor. For example, a processor may have a system clocking scheme similar to that illustrated in FIG. 3. PLL multiplier 10 receives, as an input, system clock signal 80 and outputs a high frequency clock signal 82. The high frequency clock signal may then be provided to various processor components operating within three illustrated clock domains; clock domain 90a, clock domain 90b, and clock domain 90c.

Clock domain 90, for example, may provide digital signal processor (DSP) 100a and a dedicated DSP coprocessor 100b with clock signal 84. The frequency of clock signal 84 (i.e., the frequency of the clock provided to the components in clock domain 90a) is determined by multiplexer 70a and AND gate 72a. Multiplexer 70a selects either the high frequency clock signal 82 or the system clock signal 80 for distribution to the various clocked components operating within clock domain 90a. AND gate 72a either provides the clock signal selected by the multiplexer 70a or suppresses the clock signal, thus disabling the clock trees (not shown) that distribute clock signal 84 to the clocked components of the DSP and coprocessor.

Similarly, clock domain 90b provides a clock signal 86 to, for instance, the dedicated bus (DSP bus 100c) used by the DSP subsystem to exchange data, transfer control signals, etc., and a dedicated memory (DSP SRAM 100d) such as a cache or scratch memory. Multiplexer 70b selects either the high frequency clock signal or the system clock and the AND gate either enables or disables the clock signal provided by the multiplexer. In addition, dividers 74b allow the high frequency clock signal 82 to be reduced in frequency (e.g., by a factor of 2) when the high frequency clock signal is selected.

Clock domain 90c provides clock signal 88 to various other exemplary subsystems and components of processor 100. In particular, a microcontroller (MCU) 100e, system memory 100f, a peripheral bus 100g, and an external bus 100h operate in clock domain 90c. Dividers 74c allow the high frequency clock signal 82 to be reduced in frequency by a factor of 2, 4, 6, 8, 10, 12, or 14 before being provided to multiplexer 74c for selection or bypass in the manner described above in connection with clock domains 90a and 90b.

Processor 100 may have a number of operating modes wherein one or more of the components are in an idle state and/or one or more clock domains are not required for operation. For example, consider a cellular telephone that includes processor 100. When the cellular telephone is powered on, but not being operated (i.e., in a standby mode), the cellular phone maintains contact with a base station in a cell that it is currently located. The base station periodically (e.g., every 2 seconds) broadcasts to all of the cell phones in that cell information as to whether a call has been received and the phone should transition to an call operating mode.

Known as the broadcast paging channel, the cellular phone must monitor the paging channel in order to ascertain whether it has received a call or not.

However, very little processing power is required in order to obtain the information from the paging channel. As such, the processor may only need the system clock to be running during paging channel acquisition. In contrast, the DSP may be required in order to process this information once it has been brought into the cellular telephone (e.g., stored in a memory buffer) in order to determine whether a call has been placed or not. However, for the majority of this operating mode, the DSP is not required.

As such, it may be desirable to disable the PLL when the computational demands of the processor don't require it, for instance, when the DSP is in an idle state. By placing the DSP in an idle state, the high frequency clock signal may be disabled (i.e., the frequency multiplier can be slept or disabled). However, when the processing power of the DSP is again needed, for example, to process the information obtained from the paging channel, the PLL must be activated in order to provide the necessary clock frequencies required by the increased demands on the processor.

However, there is an overhead associated with activating the frequency multiplier that is related to the latency of the PLL. In particular, during the lock time interval of a PLL, power is being consumed but no computational work is being done. The loss in effective processing time associated with activating the frequency multiplier may make it preferable, and in some circumstances, requisite that the frequency multiplier remain active, despite the additional consumption of power.

The term activating a frequency multiplier is used to describe the actions involved in increasing the frequency of an output clock signal of the frequency multiplier. Both enabling a frequency multiplier from a sleep or disabled state and increasing the multiplier ratio of the PLL are to be considered activating the frequency multiplier. The overhead associated with activating a PLL can be viewed as having both a time component and a power component.

Applicants have identified and appreciated that it may not be necessary to acquire a phase lock between an input clock signal and an output clock signal before the output clock signal may be considered operative. In particular, Applicants have determined that it may be sufficient for the output clock signal to achieve a predetermined minimum frequency and that the output clock signal not exceed a predetermined maximum frequency in order for the output clock to be considered operative. The minimum and maximum frequencies may be determined by characteristics of the clocked components to which the output clock signal is provided.

For example, if the output clock signal is a clock driving a processor, the clock signal may need to achieve some minimum frequency capable of advancing the processor without incurring any timing violations. In addition, the output clock signal may need to remain below the maximum frequency supported by the processor to insure correct operation.

In one embodiment according to the present invention, the overhead of activating a frequency multiplier is reduced by providing an operative clock signal during the lock-time interval of the frequency multiplier. In particular, the latency of the frequency multiplier is reduced to substantially equal the wake-up time of the frequency multiplier. As such, computational work may be accomplished during lock time and the effective processing time during activation of the frequency multiplier is increased.

Following below are more detailed descriptions of various concepts related to, and embodiments of, methods and apparatus according to the present invention. It should be appreciated that various aspects of the invention, as discussed above and outlined further below, may be implemented in any of numerous ways, as the invention in not limited to any particular manner of implementation. Examples of specific implementation are provided for illustrative purposes only.

For example, the PLL frequency multiplier described below will be used to illustrate various aspects of the present invention. However, the field of frequency multipliers includes numerous variations and implementations that are far reaching. It should be appreciated that the present invention is not limited by any particular frequency multiplier implementation and, as such, any frequency multiplier having finite interval of time required to synchronize an output clock signal with an input clock signal is considered to be within the scope of the invention.

The term frequency multiplier applies to any component that provides an output clock signal synchronized to an input clock signal, the output clock signal having a frequency greater than the input clock signal. In general, a frequency multiplier includes a signal generator to generate a signal having a desired frequency, a method of comparing the generated signal with an input clock signal, and a method of synchronizing the generated signal with the input clock signal based on the comparison. When the comparison is based on phase, the term phase locked loop (PLL) will be used to describe such a frequency multiplier.

Phase comparison may be realized in any number of ways such as edge tracking (i.e., comparing the rising and/or trailing edges of the clock signals), signal zero crossings, zeroes in the signal derivative, etc. In addition, phase lock may be acquired by any of various methods such as varying the frequency of the output clock signal according to the phase comparison, delaying the output clock signal according to the phase error, etc.

Figure 1:
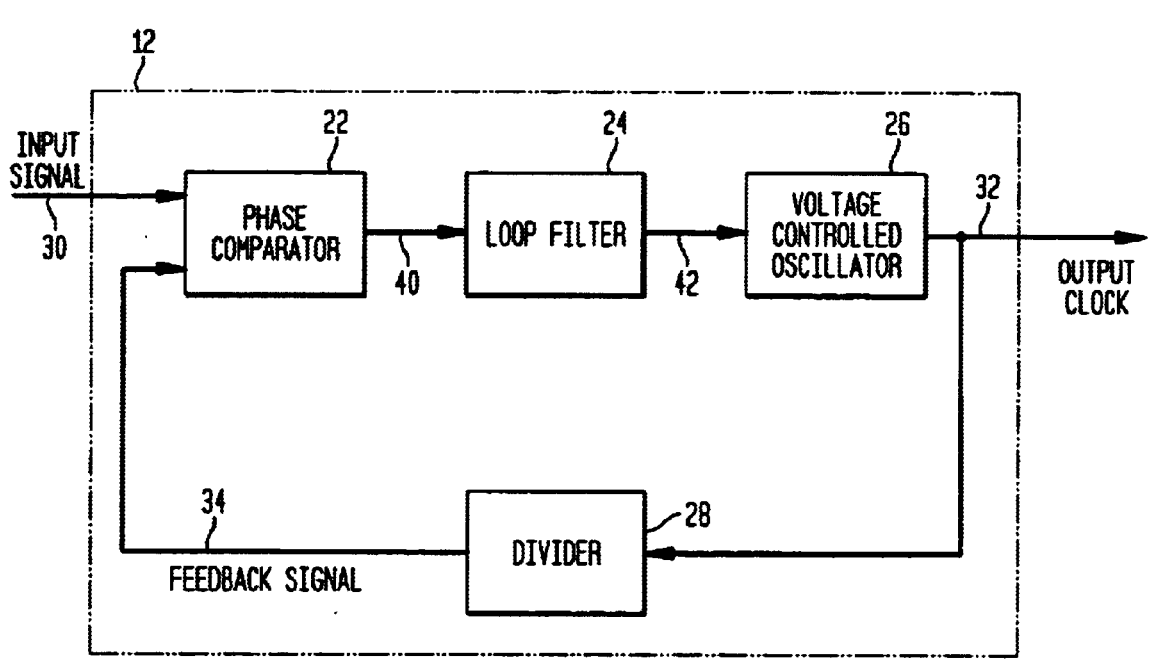
FIG. 1 illustrates a block diagram of a phase locked loop (PLL) frequency multiplier.
Figure 4:
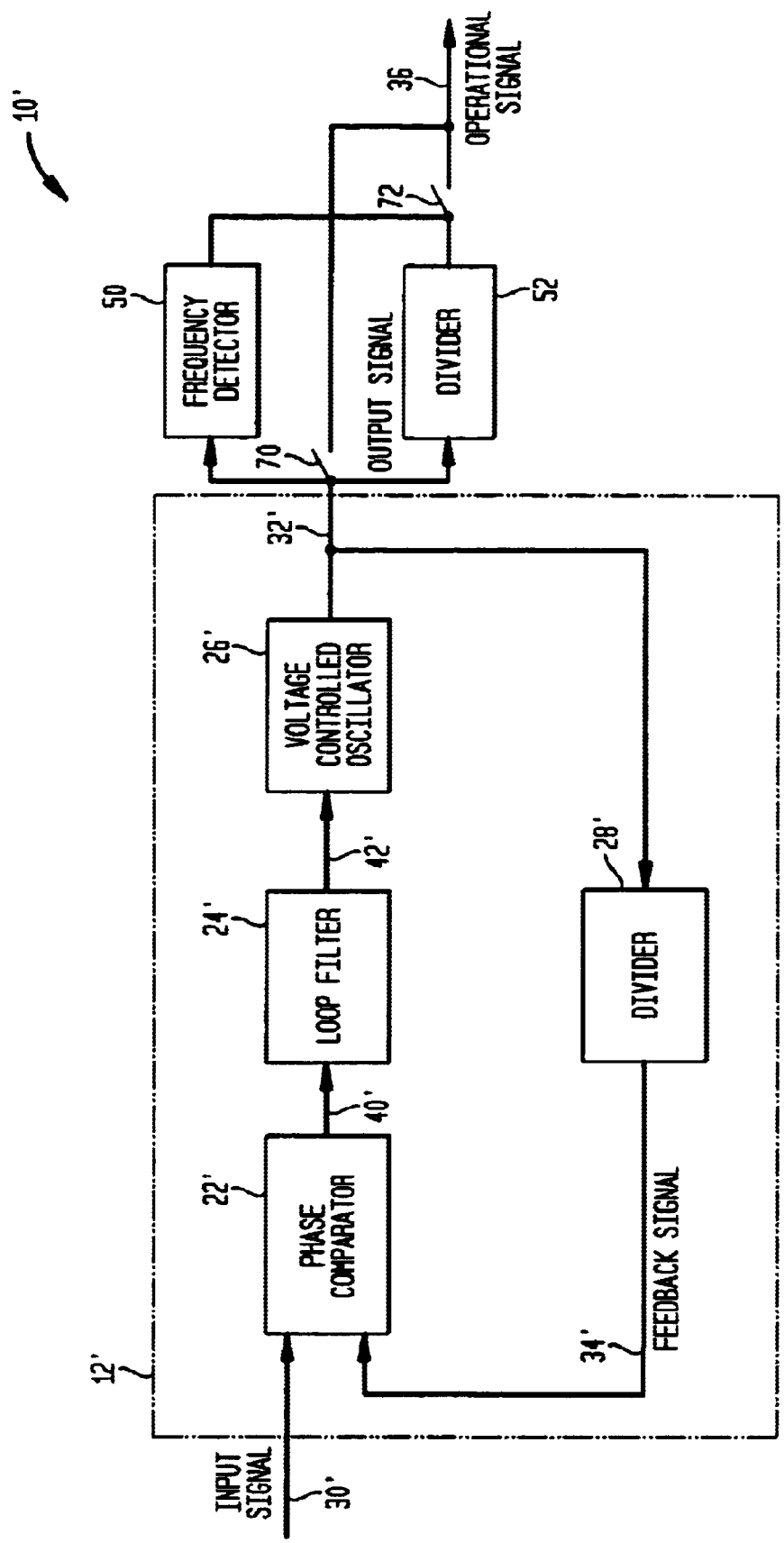
FIG. 4 illustrates a reduced latency PLL frequency multiplier according to an embodiment of the present invention.

FIG. 4 illustrates one embodiment of a frequency multiplier according to the present invention. Frequency multiplier 10' includes a phase-locked loop 12'. The phase-locked loop operates in a fashion similar to PLL 12 described in connection with FIG. 1. In particular, PLL 12' includes a phase comparator 22' providing a phase error signal 40' indicative of the phase difference between input clock signal 30' and the feedback clock signal 34'. Loop filter 24' receives the phase error signal 40' and provides voltage correction signal 42'. VCO 26' receives correction signal 42' and adjusts the voltage provided to the oscillator to provide an output clock signal that tends to reduce the magnitude of the phase error signal 40'. Divider 28' divides the output clock signal to provide the feedback clock signal 34' having a frequency that is substantially the same as the input clock signal 30' and having a phase that is substantially the same as the output clock signal 32'.

In addition, frequency multiplier 12 includes a frequency detector 50 and divider 52. The output clock signal 32', produced by VCO 26', is provided to both detector 50 and divider 52. Detector 50 and divider 52 ensure that a clock signal provided to the processor does not contain frequencies that may cause the processor to operate erroneously or cause loss of data, that is, detector 50 and divider 52 provide operative clock signal 36.

Figure 2:
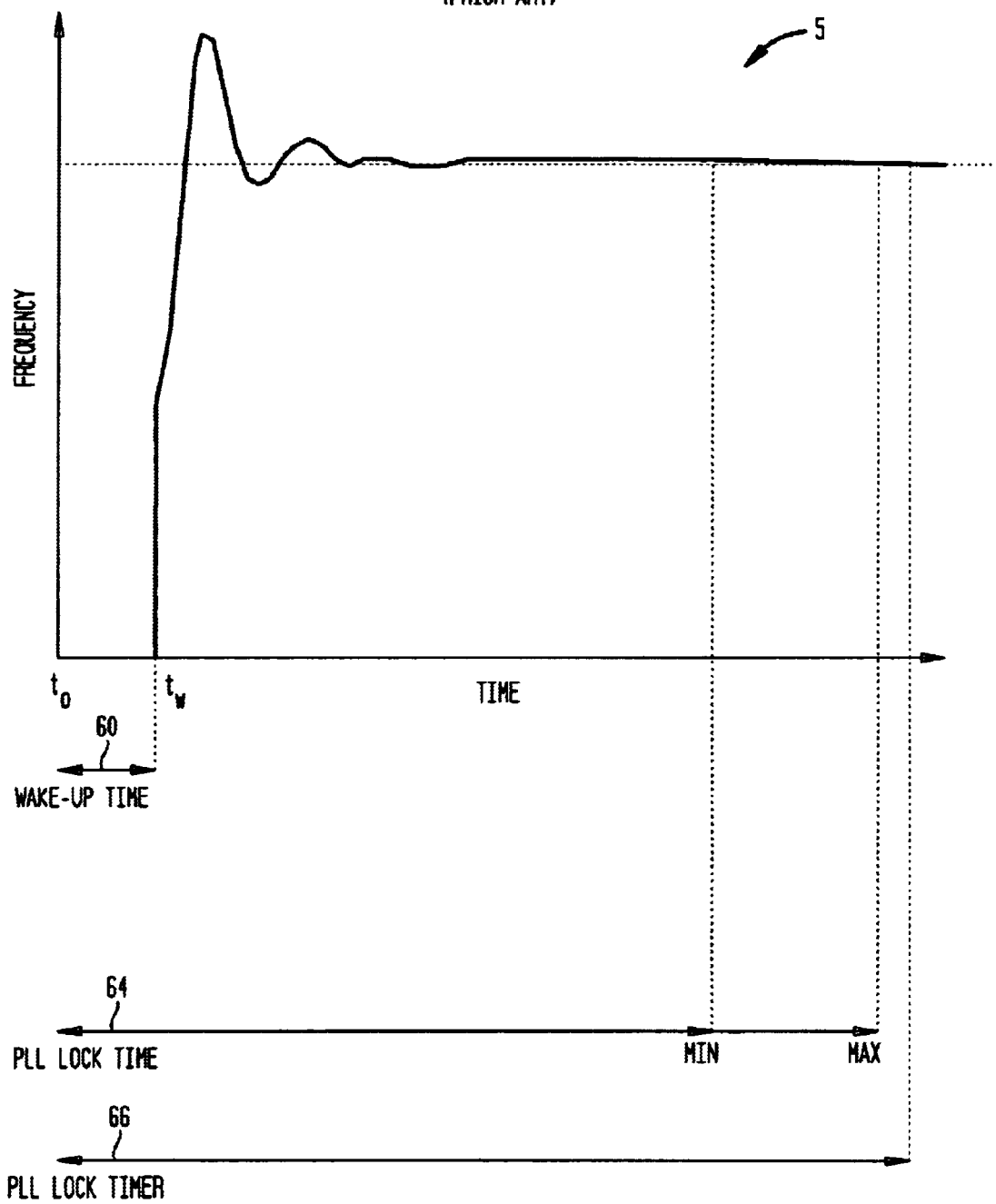
FIG. 2 illustrates a timing diagram of delays associated with activating and acquiring phase lock in the PLL frequency multiplier of FIG. 1.

After the wake-up interval (e.g., interval 60 in FIG. 2) and before the output clock signal is locked in phase with the input clock signal, the output clock signal may be susceptible to frequencies beyond that expected by the clocked components receiving the clock signal. For example, the output clock signal may experience frequencies above a target frequency. The target frequency refers to the intended frequency to be achieved by the frequency multiplier. Specifically, the target frequency is the frequency of the signal generated by the VCO after the PLL has locked.

In addition, just after the VCO is enabled (i.e., at the end of the wake-up interval), the output clock signal may experience frequencies below a threshold frequency required by the clocked components receiving the clock signal. As such, in order to provide an operative clock signal, the frequencies outside a frequency range defined by the threshold frequency and the target frequency should be suppressed.

Figure 5:
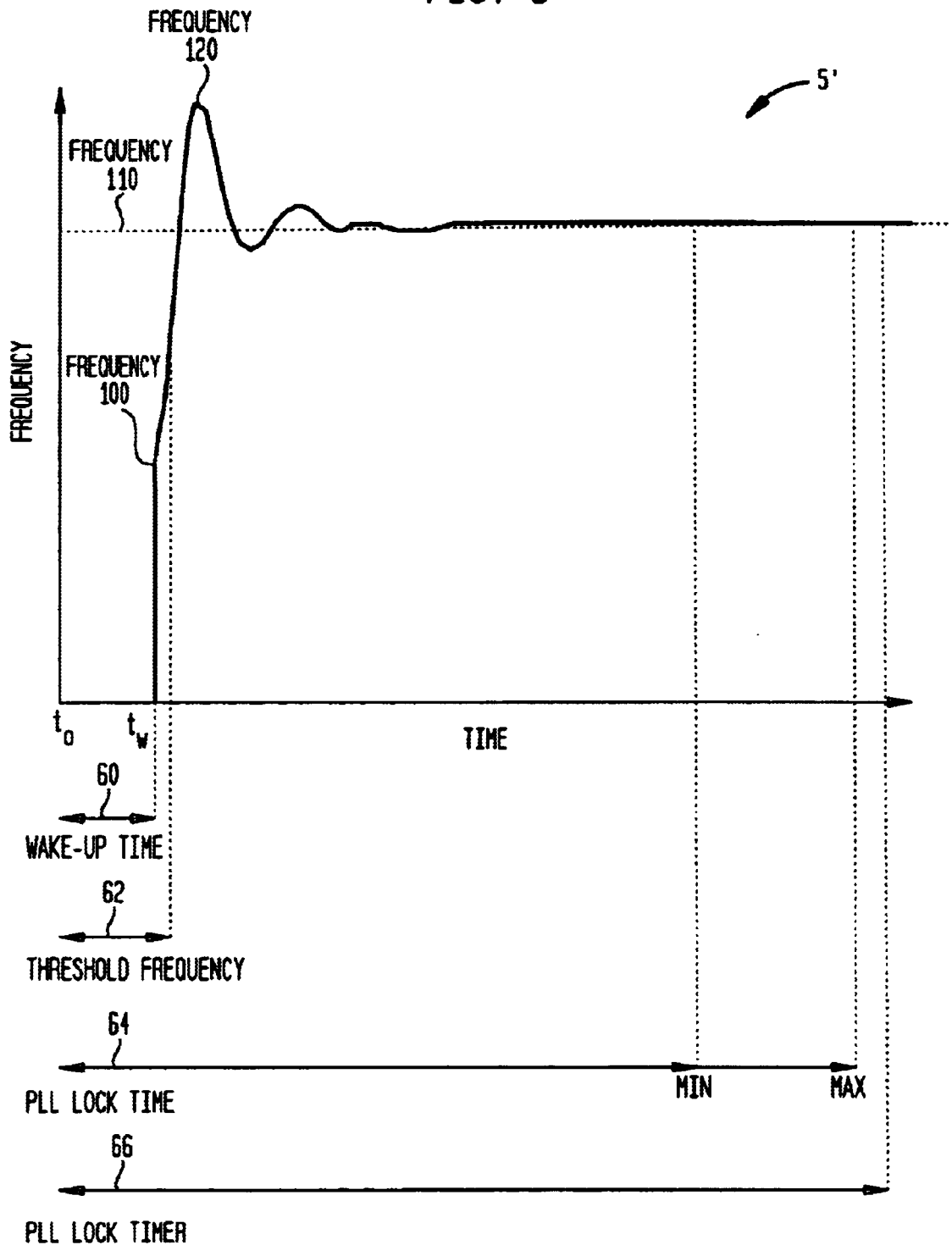
FIG. 5 illustrates a timing diagram of delays associated with activating and acquiring phase lock and the reduced latency of the PLL frequency multiplier illustrated in FIG. 4.

FIG. 5 illustrates a frequency versus time diagram characteristic of the activation interval of PLLs that are not critically damped. When the latency of a PLL is a consideration, the PLL is often not critically damped, that is, the PLL is not damped to prevent overshoot of the target frequency. Typically, a damped PLL will have an extended lock time and may not be appropriate for many applications where the PLL activation overhead is a consideration.

The target frequency (i.e., the frequency to be achieved by the frequency multiplier) of the output clock signal of the PLL is denoted by the dotted line on the frequency axis as frequency 110. For instance, the target frequency may be the high frequency clock provided to a DSP, as illustrated in FIG. 3.

After the VCO is enabled (i.e. at time $t_w$), the output clock signal achieves, almost instantaneously, a frequency 100, depicted schematically by the vertical line at time $t_w$. As illustrated, the frequency of the output clock signal ramps up and the PLL tends to overshoot the target frequency during the lock time interval. As such, the output clock signal may experience frequencies up to a frequency 120. The clock signal then oscillates in frequency about the target frequency until it converges to the target frequency as the PLL locks.

Those frequencies exceeding the target frequency 110, if provided, for example, to a processor, may cause the processor to operate erroneously. This may lead to corrupt or lost data, incorrect timing or synchronization, or may have other deleterious effects on the operation of the processor. As such, if the clock signal provided to the processor during the lock time interval is to be considered operative, frequencies exceeding the target frequency may need to be suppressed.

In order to prevent frequencies above the target frequency from being applied to the clocked components of the processor, the output clock signal 32', in the embodiment illustrated in FIG. 3, is provided to divider 52. Divider 52 divides the frequency of the output clock signal by N to insure that the clocked components of the processor will not be vulnerable to loss of data or erroneous operation due to clock signal frequencies in excess of the maximum with which the clocked components were intended to operate.

Divider 52 may be, for example, a divide-by-2 counter. The invention, however, is not limited to the choice of any particular divider ratio. Design considerations and characteristics of the PLL may guide the choice of N for each particular implementation. The choice of N, however, should prevent the clock signal provided to the processor from experiencing frequencies that may cause the processor to operate erroneously, that is, it should provide an operative clock signal.

In addition, a clocked component receiving a clock signal may have a minimum frequency with which it can operate. For example, the timing of a processor may depend on providing a clock signal above a minimum frequency. In order to insure that the clock signal is operative when the clock signal is first provided to the clocked component or components, a frequency detector 50 is provided to monitor the output clock signal. Only when the output clock signal exceeds a threshold frequency is the output from divider 52 allowed to be provided as operative clock signal 36. The threshold frequency may depend on the type and requirements of the clocked components receiving the clock signal.

FIG. 4 depicts a switch 72 controlled by the frequency detector as providing operative clock signal 36 during the lock time interval when the threshold frequency has been exceeded. However, any of various methods may be used to provide the clock signal to a clocked component or components when the signal has been determined to be operative. Typically, after the PLL has locked, divider 52 is bypassed (e.g., by closing switch 72 and opening switch 70, or by some equivalent mechanism) and the output clock signal 32' is provided as the operative clock signal to the various clocked components of the processor.

As such, frequency multiplier 10' provides an operative clock signal to the processor during the lock time interval of the PLL. Computational work, logic operations, timing, and other various processing tasks may then be performed during the lock time of the PLL. The latency of the frequency multiplier is substantially equal to the wake-up time of the PLL and, as such, the overhead of activating the PLL is reduced.

In addition, the time overhead associated with activating the PLL may be accommodated in processing situations where latencies dependent on the lock-time may have prevented the frequency multiplier from being disabled. Thus, clock frequencies provided to a processor can be dynamically adjusted to fit the computational needs of the processor without having to remain in high energy states when that level of computation is not necessary.

It should be appreciated that the arrangement, number, and type of components illustrated in the foregoing embodiments are exemplary only. Many variations in design will occur to those skilled in art. However, these variations should not be considered to depart from the scope of the invention.

For example, the divider provided to suppress frequencies above the target frequency (e.g., divider 52) need not be an additional and/or separate divider. For instance, all or part of the divider within the control loop of the PLL (e.g., divider 28') may be utilized to accomplish suppression of overshoot frequencies.

Figure 6:
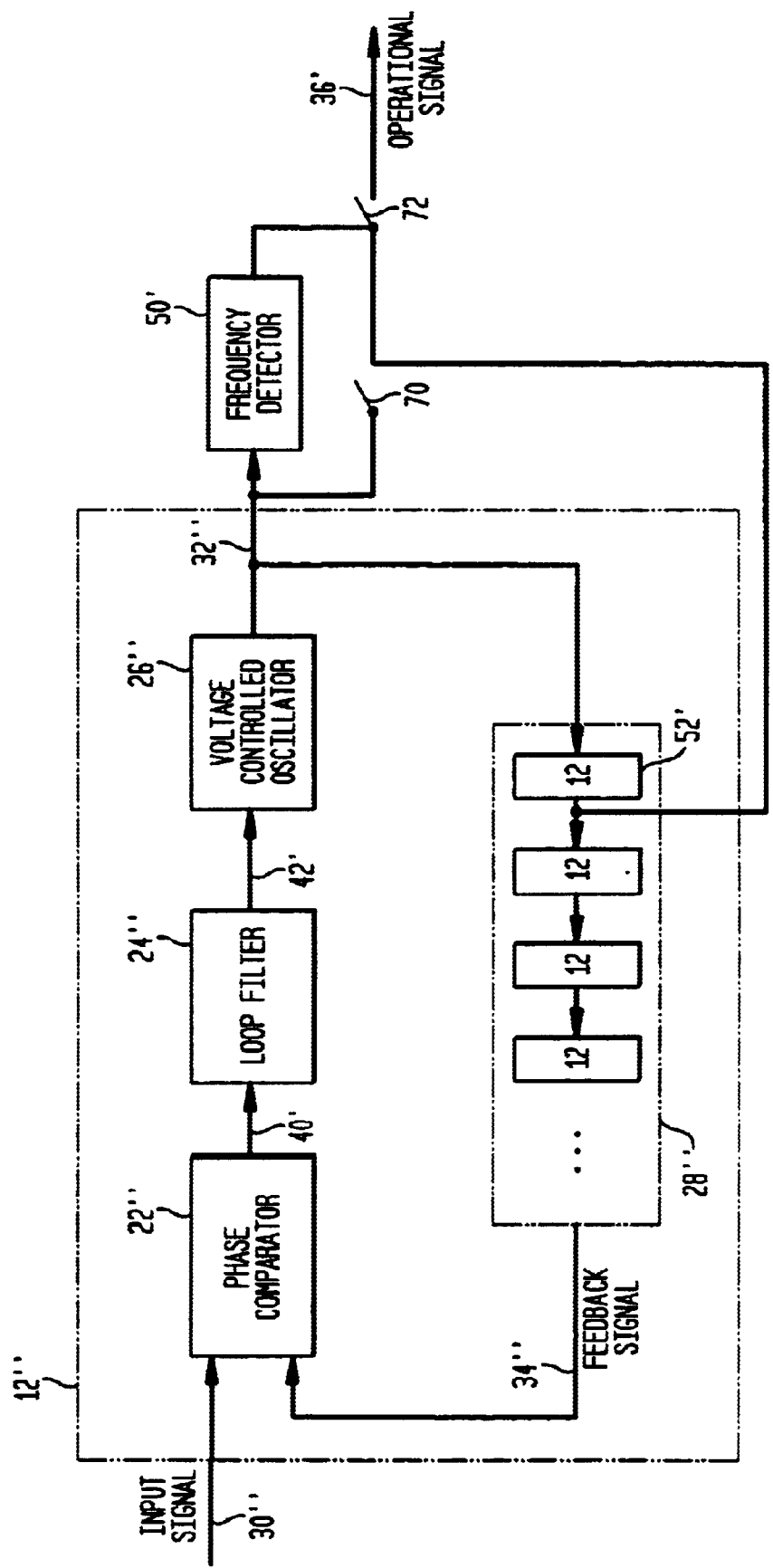
FIG. 6 illustrates a reduced latency PLL frequency multiplier according to another embodiment of the present invention.

In FIG. 6, divider 28" is illustrated as a series connected bank of divide-by-2 counters. A clock signal is tapped off after the first divide-by-2 counter and provided as operative clock signal 36', that is, divider 52' is the first divider stage of divider 28". As such, divider 52' provides a frequency reduction factor of 2 in order to suppress frequencies above a target frequency of the frequency multiplier. However, depending on the desired frequency reduction, the signal may be taken from any stage of divider 28". In addition, divider 28" need not comprise divide-by-2 counters but may be any appropriate frequency divider component having any appropriate divider ratio.

Additionally, the frequency detector to determine when a threshold frequency has been exceeded (e.g., frequency detector 50) may detect the frequency of a clock signal other than the signal provided directly from the VCO as illustrated in FIG. 7. For instance, the frequency detector may monitor the frequency of the signal after it has been provided to, or tapped off from, a divider that suppresses frequencies above a target frequency (e.g., dividers 52, 52', etc.).

In addition, a frequency detector may be programmed to detect when a clock signal has exceeded a variable threshold frequency. For example, in reference to processor 100 illustrated in FIG. 3, the largest divider factor selected in any one of the clock domains at any given time may determine what the threshold frequency should be in order to insure that each component receiving a clock signal is provided with a clock signal having a frequency that meets or exceeds the minimum frequency requirement of the clocked components. As an example, the threshold frequency may need to be increased when clock domain 90c has selected the divide by 14 factor and may be reduced when a lesser or no reduction factor has been selected.

In some embodiments, a frequency detector to detect when a threshold frequency has been exceeded may not be necessary. For example, the characteristics of the signal generator (e.g., a VCO) and requirements of the clocked components receiving the clock signal output by the frequency multiplier may be such that the initial output clock signal provided by the signal generator when it is enabled, may already be above the threshold frequency. In such cases, the frequency detector (e.g., frequency detector 50) may be replaced with logic that simply detects when the signal generator first begins to output a signal, regardless of the frequency. Since the signal generator is known to immediately achieve a frequency exceeding the threshold frequency, the output clock signal will be operative as soon as the signal generator is enabled.

Many other modifications, variations and alternatives in the number, type, and configuration of components will occur to those of skill in the art in order to provide an output clock signal having only frequencies within a specified range. These variations should be considered within the scope of the invention.

Having described several embodiments of the invention in detail, various modifications and improvements will readily occur to those skilled in the art. Such modifications and improvements are intended to be within the scope of the invention. Accordingly, the foregoing description is by way of example only, and is not intended as limiting. The invention is limited only as defined by the following claims and the equivalents thereto.

What is claimed is:

1. A frequency multiplier comprising:
   a comparator to receive an input clock signal having a first frequency and a feedback signal, the comparator providing an error signal indicative of a difference in a first property between the input clock signal and the feedback signal;
   a signal generator, coupled to the comparator, to provide an output clock signal having a second frequency, the signal generator adjusting a second property of the output clock signal based on the error signal to reduce the difference in the first property between the input clock signal and the feedback signal;
   a feedback loop having a divider to provide the feedback signal to the comparator, based on the output clock signal, the feedback loop having an associated first interval of time to reduce the difference in the first property such that the first property of the input clock signal and the first property of the feedback signal are substantially the same; and
   means for providing an operative signal, based on the output clock signal, during the first interval of time, the means including at least a portion of the divider coupled to the output clock signal to reduce the second frequency below a target frequency of the output clock signal.

2. The frequency multiplier of claim 1, wherein the means for providing an operative signal includes a detector to determine when the second frequency has exceeded a threshold frequency greater than the first frequency such that the operative signal is provided after the second frequency has exceeded the threshold frequency and before the second frequency has reached a factor of the target frequency determined by the divider.

3. The frequency multiplier of claim 2, wherein the threshold frequency is determined depending on an increase between the first frequency and the target frequency.

4. The frequency multiplier of claim 1, wherein the first property is phase.

5. The frequency multiplier of claim 4, wherein the comparator determines the difference between at least one of a leading edge and a falling edge of the input clock signal and the feedback signal.

6. The frequency multiplier of claim 4, wherein the comparator determines the difference between zero crossings of the input clock signal and the feedback signal.

7. The frequency multiplier of claim 4, wherein the second property is frequency.

8. The frequency multiplier of claim 4, wherein the second property is a delay of the output clock signal.

9. The frequency multiplier of claim 6 in combination with at least one processor.

10. The combination of claim 9, wherein the input clock signal is a processor system clock signal.

11. The combination of claim 9, wherein the first and second output clock signals are distributed to clocked components of the at least one processor.

12. The combination of claim 9, wherein the at least one processor includes a plurality of subsystems, the plurality of subsystems capable of operating at a plurality of frequencies.

13. The combination of claim 12, wherein the frequency multiplier provides clock signals to the plurality of subsystems of the at least one processor.

14. In a frequency multiplier providing a first output clock signal to be synchronized to an input clock signal, a method of reducing an overhead of activating the frequency multiplier, the method comprising acts of:
   providing the input clock signal having a first frequency to the frequency multiplier;
   generating the first output clock signal having a second frequency that substantially converges to a target frequency, the target frequency greater than the first frequency;
   detecting a time when the second frequency has exceeded a minimum frequency and before the second frequency has reached the target frequency, the time determining a beginning of a first interval;
   generating a second output clock signal from the first output clock signal, the second output clock signal having a third frequency that is less than the second frequency and does not exceed the target frequency, the third frequency substantially converging to a factor of the target frequency;
   determining when the first output clock signal is synchronized with the input clock signal, the determination of synchronization ending the first interval; and
   providing the second output clock signal to operate at least one clocked component during the first interval and providing the first output clock signal to the at least one clocked component after the first interval.

15. The method of claim 14, wherein the act of generating the second output clock signal includes an act of dividing the second frequency by N, wherein N determines the factor of the target frequency.

16. The method of claim 15, wherein the act of dividing the second frequency by N includes dividing the second frequency by at least 2.

17. The method of claim 14, wherein the frequency multiplier provides the first output clock signal to at least one processor and the act of providing the second output clock signal includes an act of providing the second output clock signal to at least one processor during the first interval.

18. In a frequency multiplier adapted to provide an output clock signal at a target frequency synchronized to an input clock signal, a method of providing an operative clock signal during a lock time interval of the frequency multiplier, the method comprising acts of:

reducing a phase difference between the input clock signal and the output clock signal in a feedback control loop, the feedback control loop providing the output clock signal to a frequency divider in order to compare, the phase difference between the input clock signal and the output clock and adjusting the output clock signal to reduce the phase difference, during the act of reducing the phase difference between the input clock signal and the feedback signal:

generating a reduced frequency output clock signal by providing the output clock signal to at least a portion of the frequency divider, the portion of the frequency divider dividing a frequency of the output clock signal by N; and providing the reduced frequency output clock signal to the at least one clocked component beginning after determining that the reduced frequency output clock signal has a frequency that exceeds a predetermined threshold frequency.

19. The method of claim 18, wherein a frequency of the output clock signal is adjusted to reduce the phase difference between the input clock signal and the feedback signal.

20. The method of claim 18, wherein a delay of the output clock signal is adjusted to reduce the phase difference between the input clock signal and the feedback signal.

21. The method of claim 18, wherein determining that the reduced frequency clock signal has a frequency that exceeds a predetermined threshold frequency includes detecting the frequency of the reduced frequency clock signal and comparing the frequency to the predetermined threshold frequency.

22. The method of claim 18, further comprising generating the output clock signal from a voltage controlled oscillator, the voltage controlled oscillator adjusting a frequency of the output clock signal to reduce the phase difference.

23. The method of claim 22, wherein determining that the reduced frequency clock signal has a frequency that exceeds a predetermined threshold frequency includes detecting when the voltage controlled oscillator first generates an output clock signal.

24. A frequency multiplier adapted to provide an operative clock signal before an output clock signal has been synchronized to an input clock signal, the frequency multiplier comprising:

a comparator to receive an input clock signal having a first frequency and a feedback signal, the comparator adapted to provide an error signal indicative of a difference in a first property between the input clock signal and the feedback signal;

a signal generator coupled to the comparator to provide a first output clock signal having a second frequency that converges substantially to a target frequency, the signal generator adjusting a second property of the first output clock signal based on the error signal to reduce the difference in the first property between the input clock signal and the feedback signal;

a divider coupled to the signal generator and having at least a first portion configured to divide the second frequency by N to provide a second output clock signal having a third frequency; and a detector adapted to monitor at least one of the first output clock signal and the second output clock signal, the detector configured to provide the second output clock signal to operate at least one clocked component beginning after the detector has determined that the second frequency has exceeded a predetermined threshold frequency greater than the first frequency and before the second frequency has reached the target frequency.

25. The frequency multiplier of claim 24, wherein the divider has at least a second portion configured to reduce the second frequency to generate the feedback clock signal provided to the phase comparator.

26. The frequency multiplier of claim 25, wherein the divider includes a plurality of stages, each stage having a first divider factor and the first portion of the divider includes at least one of the plurality of stages.

27. The frequency multiplier of claim 26, wherein the first divider factor is equal to 2.

28. The frequency multiplier of claim 24, wherein the detector monitors the first output clock signal to detect when the first output clock signal is first generated by the signal generator to determined when the second frequency has exceeded the predetermined threshold frequency.

29. The frequency multiplier of claim 24 in combination with at least one processor.

30. The combination of claim 29, wherein the input clock signal is a processor system clock signal.

31. The combination of claim 29, wherein the first and second output clock signals are distributed to clocked components of the at least one processor.

32. The combination of claim 29, wherein the at least one processor includes a plurality of subsystems, the plurality of subsystems capable of operating at a plurality of frequencies.

33. The combination of claim 32, wherein the frequency multiplier provides clock signals to the plurality of subsystems of the at least one processor.

* * * * *